United States Patent
Carino et al.

(10) Patent No.: US 11,629,960 B2
(45) Date of Patent: Apr. 18, 2023

(54) INERTIAL AND RF SENSOR FUSION

(71) Applicant: GuRu Wireless, Inc., Pasadena, CA (US)

(72) Inventors: Marc-Angelo Carino, Los Angeles, CA (US); Seyed Ali Hajimiri, La Canada, CA (US); Behrooz Abiri, Pasadena, CA (US); Florian Bohn, Pasadena, CA (US)

(73) Assignee: GuRu Wireless, Inc., Pasadena, CA (US)

(*) Notice: Subject to any disclaimer, the term of this patent is extended or adjusted under 35 U.S.C. 154(b) by 539 days.

(21) Appl. No.: 16/577,943

(22) Filed: Sep. 20, 2019

(65) Prior Publication Data

US 2020/0096342 A1 Mar. 26, 2020

Related U.S. Application Data

(60) Provisional application No. 62/734,132, filed on Sep. 20, 2018.

(51) Int. Cl.
*G01C 21/18* (2006.01)
*G01C 21/16* (2006.01)
(Continued)

(52) U.S. Cl.
CPC ....... *G01C 21/188* (2020.08); *G01C 21/1654* (2020.08); *G01R 23/15* (2013.01); *G01R 33/0094* (2013.01)

(58) Field of Classification Search
CPC ...... G01C 21/16; G01C 21/165; G01R 23/15; G01R 33/0094; G01R 33/02
(Continued)

(56) References Cited

U.S. PATENT DOCUMENTS 9,995,284 B1 * 6/2018 Gutsche .................. B60K 8/00
10,200,819 B2 * 2/2019 Hill ........................ H04W 4/026
(Continued)

OTHER PUBLICATIONS

Aarabi, P., et al., "Phase-based dual-microphone robust speech enhancement," IEEE Transactions on Systems, Man, And Cybernetics—Part B: Cybernetics, vol. 34, No. 4, Aug. 2004, pp. 1763-1773. <<http://citeseerxist.psu.edu/viewdoc/download?doi=10.1.1.9.9360&rep=repl&type=pdf>>.
(Continued)

*Primary Examiner* — Giovanni Astacio-Oquendo
(74) *Attorney, Agent, or Firm* — Weaver Austin Villeneuve & Sampson LLP

(57) ABSTRACT

A method of determining the orientation of a device having disposed therein, in part, an inertia measurement unit, a phased array receiver, and a controller, includes, in part, detecting the difference between phases of an RF signal received by at least a pair of receive elements of the phased array receiver, determining the angle of incidence of the RF signal from the phase difference, using the angle of incidence to determine the projection of a vector on a plane of an array of transmitters transmitting the RF signal, and determining the yaw of the device from the projection of the vector. The vector is a three-dimensional vector representative of the orientation of the plane of the phased array receivers relative to the plane of the array of transmitters transmitting the RF signal.

7 Claims, 2 Drawing Sheets

(51) Int. Cl.
  *G01R 33/00* (2006.01)
  *G01R 23/15* (2006.01)
(58) Field of Classification Search
  USPC .......................................................... 701/500
  See application file for complete search history.

(56) References Cited

U.S. PATENT DOCUMENTS

| | | | | |
|---|---|---|---|---|
| 10,258,377 | B1* | 4/2019 | Lavi | A61B 34/10 |
| 10,983,605 | B2* | 4/2021 | Fonken | G01S 5/16 |
| 2013/0162537 | A1* | 6/2013 | Sato | G06F 3/0346 |
| | | | | 345/158 |
| 2020/0011961 | A1* | 1/2020 | Hill | G01S 5/0257 |

OTHER PUBLICATIONS

Andrejasic, M., "MEMS Accelerometers," University of Ljubljana, Seminar Paper, Mar. 2008, 17 pp. <<http://mafija.fmf.unilj.si/seminar/files/2007_2008/MEMS_accelerometers-koncna.pdf>>.

"Angular Displacement," Wikipedia article, last edited Jun. 2, 2022, at 19:50 (UTC), 6 pp. downloaded Dec. 7, 2022, Retrieved from <<https://en.wikipedia.org/w/index.php?title=Angular_displacement &oldid=1091195533>>.

Berner, P., "Orientation, Rotation, Velocity and Acceleration, and the SRM," Version 2,0, Jun. 20, 2008, 69 pp., <<http://www.sedris.org/wg8home/Documents/WG80485.pdf>>.

Madgwick, S. O. H., "An efficient orientation filter for inertial and inertial/magnetic sensor arrays," Apr. 30, 2010, 32 pp. <<http://x-io.co.uk/res/doc/madgwick internal report.pdf>>.

Niu, Y., et al., "A survey of millimeter wave (mmWave) communications for 5G: opportunities and challenges," arXiv: 1502.07228 [cs.NI], Feb. 25, 2015, <<http://arxiv.org/abs/1502.07228vl>>.

Pedley, M., "Tilt sensing using a three-axis accelerometer," Freescale Semiconductor Application Note, Document No. AN3461, Rev. 6, Mar. 2013, 22 pp. <<https://cache.freescale.com/files/sensors/doc/app_note/AN3461,pdf>>.

* cited by examiner

INERTIAL AND RF SENSOR FUSION

CROSS REFERENCE TO RELATED APPLICATIONS

The present application claims benefit under 35 USC 119(e) of U.S. Application Ser. No. 62/734,132, filed Sep. 20, 2018, the content of which is incorporated herein by reference in its entirety.

FIELD OF THE INVENTION

The present invention relates to a method for determining the orientation of a mobile device.

BACKGROUND OF THE INVENTION

Orientation estimation is often performed in applications or devices, such as spacecraft and other aerospace technologies in which accurate knowledge of the point toward which a device is directed is required. Attitude Heading Rate System (AHRS) algorithms, such as Kalman filtering, have been instrumental in mitigating sensing errors such gyro bias, temperature drift, and the like. MEMS sensing devices and improved compute capabilities have also improved orientation estimation in portable electronics, smartphones and virtual/augmented reality (VR/AR).

In portable applications, the sensing environment is often subject to widely varying conditions. In sensing the Earth's magnetic field within a household, the field vector (inclination) is affected by building materials, electrical wiring, and other such elements.

In kinematics, the angular displacement or rotation of a rigid body is the angle through which the body revolves around a center of a specified axis. Rotations of a rigid body, from one orthonormal basis to another, can be parameterized in three dimensions as Euler angles, Direction Cosine Matrix (DCM), or in four dimension as Qauternions.

Consumer-grade inertia measurement units (IMUs) use micro electro-mechanical systems (MEMS) perform inertial measurements. For example, a micromachined mass-spring-damper combined with a parallel plate capacitor arrangement may be used to determine the linear acceleration.

A triaxial accelerometer provides a measure of acceleration which is the sum of Earth's gravitational field (static acceleration) and the rigid body's acceleration (dynamic acceleration), with respect to the sensor's reference frame. Assuming that the dynamic acceleration is negligible or removable algorithmically, the accelerometer provides information about the gravity vector and indicates which direction is down. A triaxial gyroscope provides a measure of the angular velocity. Accelerometers and gyroscopes (as with other sensing technologies) exhibit non-ideal behaviors such as noise and time-varying biases. Therefore, their measurements include error.

BRIEF SUMMARY OF THE INVENTION

A method of determining the orientation of a device having disposed therein, in part, an inertia measurement unit, a phased array receiver, and a controller, includes, in part, detecting the difference between phases of an RF signal received by at least a pair of receive elements of the phased array receiver, determining the angle of incidence of the RF signal in accordance with the phase difference, using the angle of incidence to determine a projection of a vector on a plane of an array of transmitters transmitting the RF signal, and determining the yaw ($\varphi_{yaw}$) of the device from the projection of the vector. The vector is a three-dimensional vector representative of an orientation of the plane of the phased array receivers relative to a plane of the array of transmitters transmitting the RF signal.

In one embodiment, components of the vector have values defined by the inertia measurement unit. In one embodiment, the device uses the received RF signal too charge itself. In one embodiment, the yaw is defined by $$\varphi_{yaw} = \tan^{-1}\left(\frac{b_y}{b_x}\right),$$

wherein $b_y$ and $b_x$ are respectively y and x component of the projection of the vector.

In one embodiment, the vector is defined by $b=(n \times V_{beam}) \times n$, wherein n is a unit vector perpendicular to the plane of the array of transmitters and $V_{beam}$ is a three-dimensional vector defining a degree of rotation of the device about three axis supplied by the inertia measurement unit. In one embodiment, the array of transmitters is a phased array transmitter. In one embodiment the vector component values are determined by a magnetic sensor.

DETAILED DESCRIPTION OF THE INVENTION

Embodiments of the present invention provide an enhanced measure of the orientation of a device by combining the orientation information obtained using an IMU disposed in the device together with the orientation information obtained using a phased array receiver also disposed in the device. The phased array receiver is adapted to receive an RF signal transmitted by an RF signal generating unit. In one embodiment, the RF signal is may be used to wirelessly charge the device in which the phased array receiver is disposed.

Figure 1:
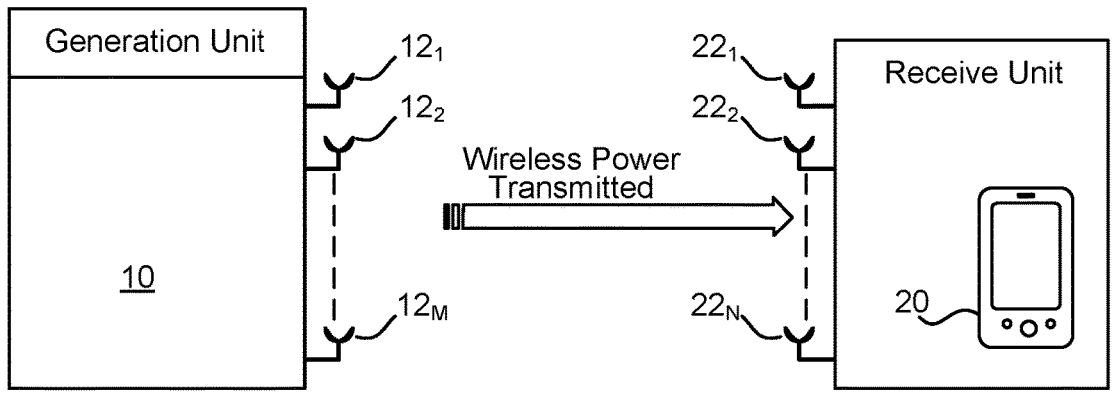
FIG. 1 is a simplified high-level block diagram of an RF power transmitting or generating unit transmitting RF signal to a mobile device, in accordance with one exemplary embodiment of the present invention.

FIG. 1 shows an RF power transmitting/generating unit (hereinafter alternatively referred to as GU) transmitting RF signals via M transmit antennas $12_1, 12_2 \ldots 12_M$ to mobile device 20. Mobile device 20 is shown as having N receive antennas $22_1, 22_2 \ldots 22_N$ forming an element phased array receiver. The mobile device receiving the RF signal from the GU is alternatively referred to herein as receiving unit (RU).

Figure 2:
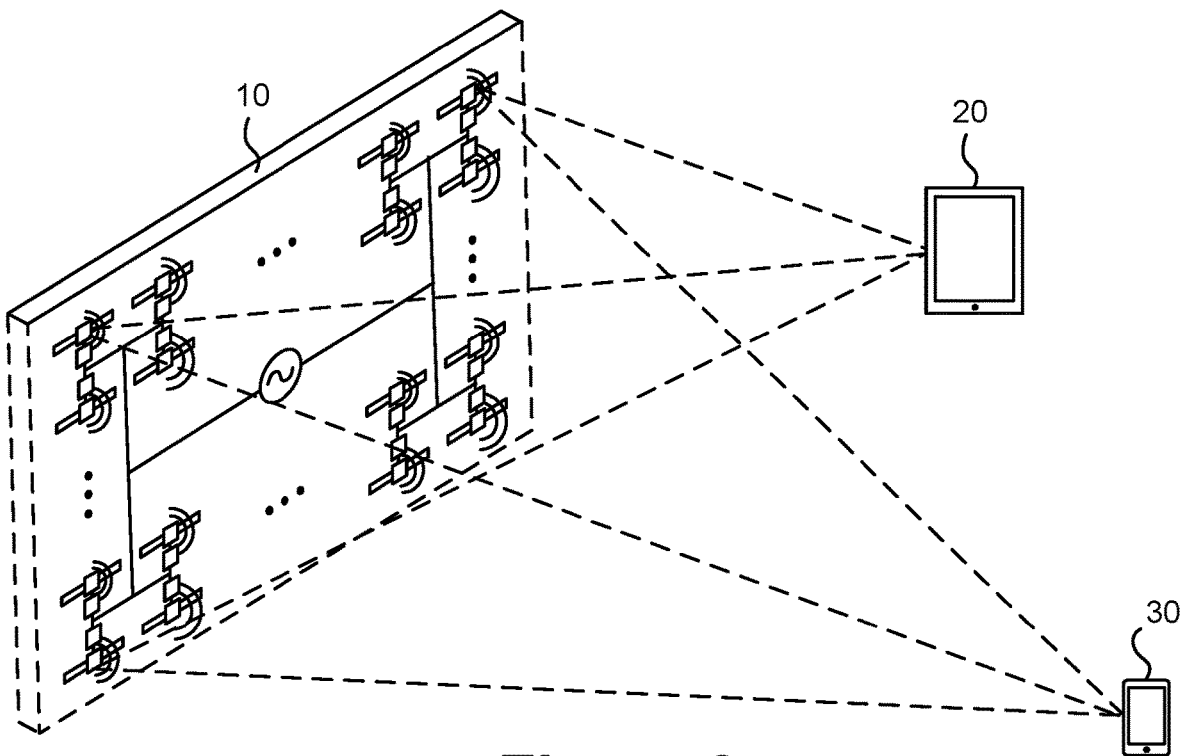
FIG. 2 shows an RF power transmitting or generating unit concurrently transmitting RF signal to a multitude of mobile devices, in accordance with one exemplary embodiment of the present invention.
Figure 3:
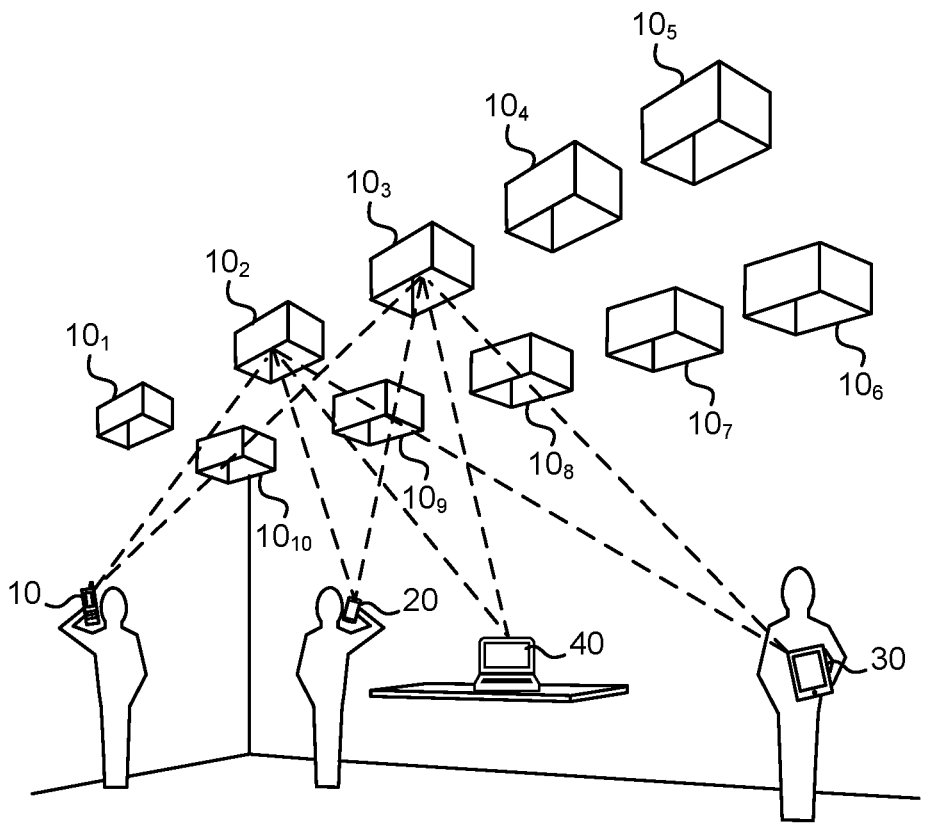
FIG. 3 shows a multitude of RF power transmitting or generating units transmitting RF signals to a multitude of mobile devices, in accordance with one exemplary embodiment of the present invention.

FIG. 2 shows a GU 10 concurrently transmitting RF signals to RU 20 and RU 30 using focused waves of similar or different strengths. RUs 20 and 30 may use the received RF signal to charge themselves. FIG. 3 shows 10 GUs $10_i$, where i is an index varying from 1 to 10 in this example, wirelessly charging mobile phones 10, 20, tablet PC 30 and desktop PC 40, in one embodiment. In FIG. 3 GUs $10_i$ are shown as being mounted on the walls and ceiling. But it is understood that a GU may be placed on cabinets, appliances, furniture, and the like.

Each RU 20 is assumed to have an IMU adapted to provide information regarding the rotation and acceleration of the RU relative to a reference frame. Each RU 20 may include a magnetic sensor adapted to detect the direction and strength of the magnetic field generated by the Earth. Embodiments of the present invention use the difference in phases of the signals received by various receive elements of the phased array receiver of the RU to further enhance the accuracy of the rotation information provided by the IMU. In the following description, the Tait-Bryan convention, either in 1-2-3 format, X-Y-Z format, or roll-pitch-yaw format, is used to represent the three dimensional parameterization of the Euler angles.

Assume that the gravitational field is defined by vector $\vec{g}$. Assume that the RU's dynamic acceleration a is negligible relative to $\vec{g}$. The RU's acceleration along directions x, y and z are respectively identified as $a_x$, $a_y$, $a_z$. The RU's roll $\varphi_{roll}$ and pitch $\theta_{pitch}$ are determined by the IMU as shown below:

$$\varphi_{roll} = \tan^{-1}\frac{a_y}{a_z}$$

$$\theta_{pitch} = \tan^{-1}\left(\frac{-a_x}{\sqrt{a_y^2 + a_z^2}}\right)$$

The measure of RU's yaw $\psi_{yaw}$ however is improved by the relative phases of the signals received by the phased array receiver of the RU, as described further below, thereby enabling sensor fusion with the IMU to improve overall orientation estimation.

A number of AHRS algorithms use the angular velocity ω determined by a gyroscope to provide high-frequency updates to the orientation estimate. Assuming that an estimate of the orientation of the body at time $t_1$ is represented by $\omega_1$, and the update period is $t_{update}$, the estimate of the orientation at the next update time $t_2$, (i.e., $\Omega_2$) may be determined as shown below:

$$\Omega_2 = \Omega_1 + (\omega \cdot t_{update})$$

A GU often includes a linear, rectangular or circular phased array antenna elements adapted to transmit RF energy at millimeter wave frequencies. A phased array is thus adapted to change the direction of the signal it transmits through constructive interference and without requiring a mechanical change in the arrangement or positions of the antennas of the array.

Assume that the GU antenna array is configured with no phase shifts thereby causing the wavefront to propagate in a direction that is orthogonal (broadside) to the plane of the array. Assuming a dipole antenna in the RU receive array, the sensitivity pattern is approximated with $\gamma(\psi)=\cos(\psi)$ and $\psi=(-\pi, \pi)$. Since $\cos(\psi)$ is an even function, it is symmetrical about $\psi=0$ and thus may lead to angular ambiguities when using the received energy alone.

In accordance with one aspect of the present invention, the phase difference between two or more antennas of the RU receiver array is used to determine additional information about the orientation of the RU. The wavefront incident angle may be determined using angle-of-arrival (AoA), direction-of-arrival (DoA), and time-difference-of-arrival (TDoA) techniques, as is commonly known. In its simplest form, estimating the AoA may be achieved using the relative phase information between at least 2 antennas. The spacing between each pair of adjacent antennas is assumed to be half the wavelength of the signal being received.

Assume x(t) represents the signal received by one of the antennas of the RU and s(t) represents the signal transmitted by the GU. Assume further that (i) the system is a linear time-invariant (LTI) system, (ii) the impulse response of the antenna is represented by h(t), and (iii) the noise n(t) is an additive white Gaussian noise represented by n (μ, a²). The signal x(t) received by the array and impulse response h(t) of the array may be represented as shown below:

$$x(t)=[x_1(t), x_2(t) \ldots x_n(t)]^T$$

$$h(t)=[h_1(t), h_2(t) \ldots h_n(t)]^T$$

The signal received by the receiver array may thus be represented as:

$$x(t)s(t)*h(t)+n(t)$$

It is understood that h(t) varies depending on the angle of incidence of the wavefront. Since all the receive antennas of the RU are assumed to have similar characteristics, the difference in the signals the antennas receive appears as a time shift $\tau_n$, which, in turn, depends on the relative positions of the antennas. Assume that the time shift for the reference antenna is 0, i.e., $\tau_0 = 0$ for the reference antenna.

For a uniform linear array of receive antennas, the time shift associated with the $n^{th}$ antenna is defined by:

$$\tau_n = \frac{nd_x \cos\theta}{c} \quad (1)$$

where n represents the index number of the antenna, $d_x$ represents the antenna spacing, c is the speed of light, and θ represents the angle of incidence of the RF signal.

For a uniform linear array having 3 receive antennas, a wavefront arriving off-axis from boresight has an impulse response defined by:

$$h_1(t-\tau^{-1})$$

$$h(t)=h_2(t)$$

$$h_3(t-\tau_{-1})$$

The above relationship also applies to uniform rectangular array of antennas. A number of algorithms, such as MUSIC, ESPRIT, GCC PHAT, are commercially available to provide an estimate of in for a phased array receiver using x(t). Therefore, knowing $\tau_n$, the angle of incidence θ may be obtained from equation (1) to determine the azimuth and elevation of the phased array receive elements.

An IMU disposed in a mobile device having a phased array receiver provides an estimate of the roll and pitch. The angle of incidence of the waveform provides an estimate of the azimuth and elevation using any one of the conventional algorithms described above. The yaw of the mobile device may be calculated as shown below where functions cos(x)

and sin(x) are abbreviated as c, and s, where R is a 3-dimensional vector representing roll, pitch and yaw:

$$R_{123} = \begin{bmatrix} c_\theta c_\psi & c_\theta s_\psi & -s_\theta \\ s_\phi s_\theta c_\psi - c_\phi s_\psi & s_\phi s_\theta s_\psi + c_\phi c_\psi & c_\theta s_\phi \\ c_\phi s_\theta c_\psi + s_\phi s_\psi & c_\phi s_\theta s_\psi - s_\phi c_\psi & c_\theta c_\phi \end{bmatrix}$$

Assume $\phi p=0$, $\theta$ represents the elevation and $\psi$ represents the azimuth. Accordingly, $R_{123}$ may be simplified as:

$$R_{123} = \begin{bmatrix} c_\theta c_\psi & c_\theta s_\psi & -s_\theta \\ -s_\psi & c_\psi & 0 \\ s_\theta c_\psi & -s_\theta s_\psi & c_\theta \end{bmatrix}$$

The beam vector $V_{beam}$ may then be defined as:

$$V_{beam} = R_{123} \begin{bmatrix} 1 \\ 0 \\ 0 \end{bmatrix}$$

The projection of the beam vector $V_{beam}$ onto the plane described by the current tilt value defines the yaw, thereby fully determining the orientation. Assume that vector b represents the projection of the beam vector $V_{beam}$, and n is a unit vector orthogonal to the plane of the GU. Accordingly, vector b may be obtained as shown below:

$$b = (n \times V_{beam}) \times n$$

The x and y components of vector b, namely $b_y$ and $b_x$ are then used to determine the yaw as shown below:

$$\varphi_{yaw} = \tan^{-1}\left(\frac{b_y}{b_x}\right)$$

As described above, the roll and the pitch are defined by the acceleration along the x, y and z directions as determined by the IMU sensor:

$$\varphi_{roll} = \tan^{-1}\frac{a_y}{a_x}$$

$$\theta_{pitch} = \tan^{-1}\left(\frac{-a_z}{\sqrt{a_y^2 + a_x^2}}\right)$$

Figure 4:
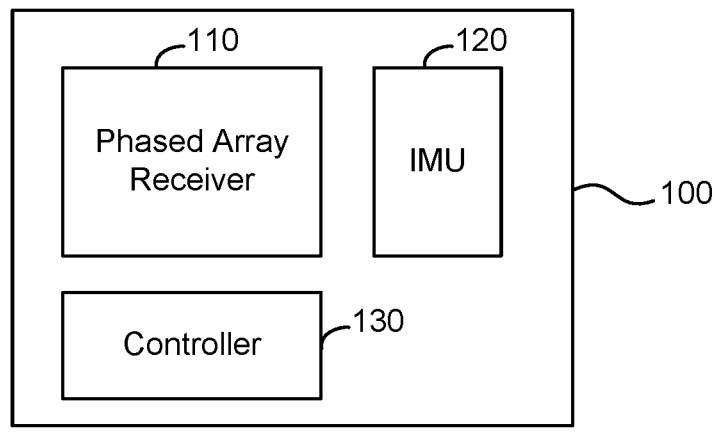
FIG. 4 is a simplified high-level block diagram of a device, in accordance with one exemplary embodiment of the present invention.

FIG. 4 is a simplified high-level block diagram of an RU 100, in accordance with one embodiment of the present invention. RU 100 is shown as including, in part, a phased array receiver 110, an IMU 120 and a controller 130. Controller 130 is adapted to perform the computations described above to improve the measure of yaw of RU 100.

The above embodiments of the present invention are illustrative and not limitative. Other additions, subtractions or modifications are obvious in view of the present disclosure and are intended to fall within the scope of the appended claims.

What is claimed is:

1. A method of determining an orientation of a device comprising an inertia measurement unit, a phased array receiver, and a controller, the method comprising:
   receiving an RF signal by at least first and second antennas of the phased array receiver;
   detecting a difference between phases of the received RF signal;
   determining an angle of incidence of the RF signal in accordance with the phase difference;
   using the angle of incidence to determine a projection of a vector on a plane of an array of transmitters transmitting the RF signal, said vector being a three-dimensional vector representative of an orientation of a plane of the phased array receivers relative to a plane of the array of transmitters transmitting the RF signal; and
   determining a yaw ($\varphi_{yaw}$) of the device from the projection of the vector.

2. The method of claim 1 wherein said vector comprises component values defined by the inertia measurement unit.

3. The method of claim 2 wherein said RF signal charges the device.

4. The method of claim 1 wherein the yaw is defined by:

$$\varphi_{yaw} = \tan^{-1}\left(\frac{b_y}{b_x}\right),$$

where $b_y$ and $b_x$ are y and x components of the projection of said vector.

5. The method of claim 4 wherein said vector is defined by: $b=(n \times V_{beam}) \times n$, wherein n is a unit vector perpendicular to the plane of the array of transmitters and $V_{beam}$ is a three-dimensional vector defining a degree of rotation of the device about three axis as supplied by the inertia measurement unit.

6. The method of claim 1 wherein said array of transmitters is a phased array transmitter.

7. The method of claim 1 wherein said vector comprises component values defined by a magnetic sensor.

* * * * *